(12) United States Patent
Bicker et al.

(10) Patent No.: US 8,592,015 B2
(45) Date of Patent: Nov. 26, 2013

(54) CONTAINER HAVING IMPROVED EASE OF DISCHARGE PRODUCT RESIDUE, AND METHOD FOR THE PRODUCTION THEREOF

(75) Inventors: Matthias Bicker, Mainz (DE); Hartmut Bauch, Ober-Olm (DE); Andreas Hahn, Hochstetten-Dhaun (DE); Stefan Bauer, Alzey (DE); Manfred Lohmeyer, Nackenheim (DE); Robert Hormes, Wolfertswil (CH)

(73) Assignee: Schott AG, Mainz (DE)

( * ) Notice: Subject to any disclaimer, the term of this patent is extended or adjusted under 35 U.S.C. 154(b) by 918 days.

(21) Appl. No.: 12/448,232

(22) PCT Filed: Dec. 12, 2007

(86) PCT No.: PCT/EP2007/011493
§ 371 (c)(1),
(2), (4) Date: Nov. 2, 2009

(87) PCT Pub. No.: WO2008/071458
PCT Pub. Date: Jun. 19, 2008

(65) Prior Publication Data
US 2010/0075077 A1    Mar. 25, 2010

(30) Foreign Application Priority Data
Dec. 12, 2006 (DE) .......................... 10 2006 058 771

(51) Int. Cl.
*B32B 1/06* (2006.01)
*C23C 16/513* (2006.01)
*C23C 16/02* (2006.01)
*C23C 16/46* (2006.01)

(52) U.S. Cl.
USPC .......... 428/34.4; 427/535; 427/578; 427/579; 428/35.7; 428/429; 428/448; 428/451

(58) Field of Classification Search
USPC ........ 427/535, 578, 579; 428/34.4, 35.7, 429, 428/448, 451
See application file for complete search history.

(56) References Cited

U.S. PATENT DOCUMENTS

| 2,504,482 | A | 4/1950 | Goldman ...................... 604/403 |
| 5,736,207 | A * | 4/1998 | Walther et al. ............... 428/34.7 |
| 5,972,436 | A | 10/1999 | Walther |
| 2003/0215652 | A1* | 11/2003 | O'Connor .................... 428/451 |
| 2006/0264044 | A1 | 11/2006 | Kobayashi et al. |

FOREIGN PATENT DOCUMENTS

| DE | 4445427 | 6/1996 |
| DE | 19629877 | 3/1997 |
| DE | 195 43 133 | 5/1997 |
| DE | 19921303 | 10/2000 |
| DE | 10258681 | 2/2004 |
| EP | 0711817 | 5/1996 |
| EP | 0960958 | 12/1999 |
| JP | 2005290560 | 10/2005 |
| JP | 2006131938 | 5/2006 |
| WO | WO 03/031362 | 4/2003 |

OTHER PUBLICATIONS

Walkiewicz-Pietrzykowska et al.; "Type of Precursor and Synthesis of Silicon Oxycarbide ($SiO_xC_yH$)Thin Films with a Surfatron Microwave Oxygen/Argon Plasma"; American Vacuum Society; Jul./Aug. 2006; pp. 988-994.
International Search Report for PCT/EP2007/011493 dated Apr. 18, 2008.
International Preliminary Examination Report dated Jun. 24, 2009 corresponding to PCT/EP07/11493.
English Translation of German Office Action dated Jun. 6, 2011 corresponding to German Patent Application No. 10 2006 058 771.5.
Notification of Reason for Refusal dated May 8, 2012 corresponding to Japanese Patent Application No. 2009-540670.

* cited by examiner

*Primary Examiner* — D. S. Nakarani
(74) *Attorney, Agent, or Firm* — Ohlandt, Greeley, Ruggiero & Perle, L.L.P.

(57) ABSTRACT

In order to improve the emptying of residual contents from containers, such as pharmaceutical packaging, the invention provides corresponding substrates with a hydrophobic coating. Provided for this purpose is a composite material which comprises a substrate and a coating deposited on it, which forms at least a part of the surface of the coated substrate, with the coating having a compound containing the elements C, O, and H, with further elements, apart from Si, C, H, having a content of less than 10 at %, preferably less than 5 at %, characterized in that this compound has a composition $SiO_xC_yH_z$, in which x is at most 1.2.

36 Claims, 1 Drawing Sheet

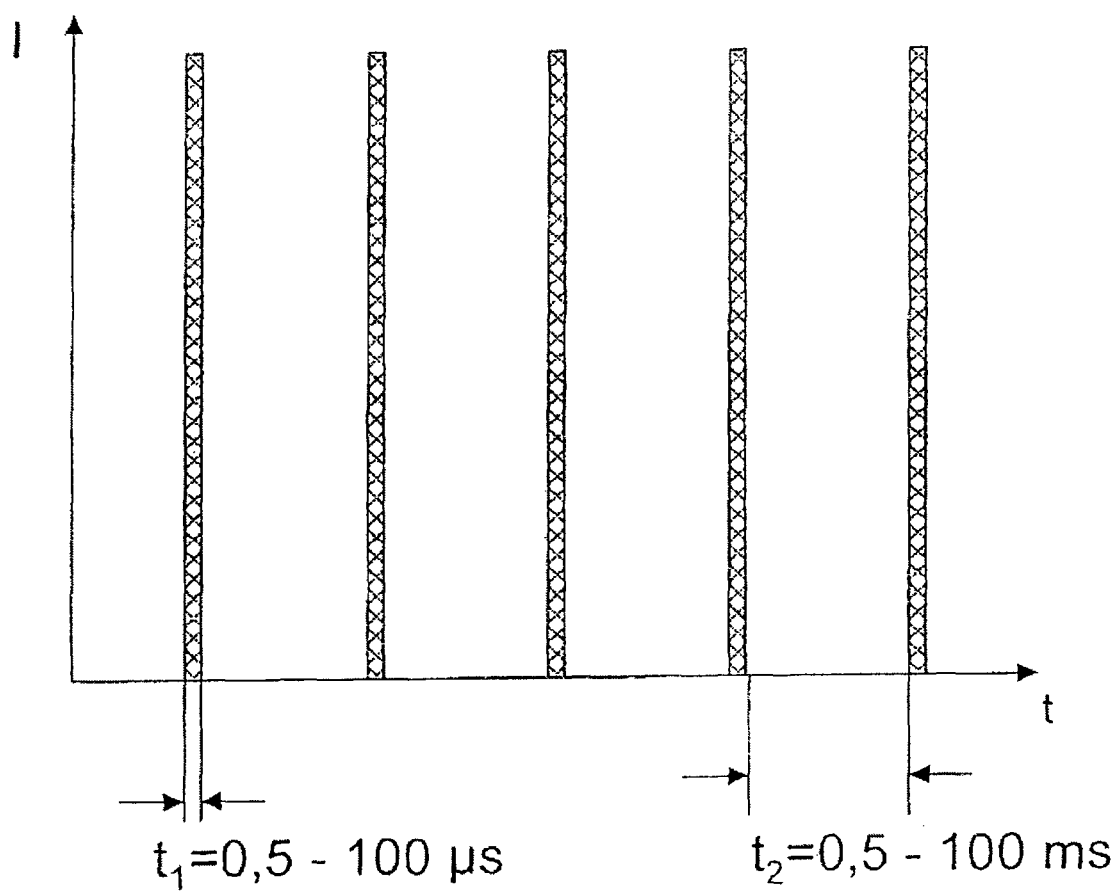

CONTAINER HAVING IMPROVED EASE OF DISCHARGE PRODUCT RESIDUE, AND METHOD FOR THE PRODUCTION THEREOF

The invention relates in general to the production of coatings by means of chemical vapor deposition (CVD) and, in particular, to a method for applying hydrophobic layers to a substrate as well as to products that can be produced in accordance with the method.

Particularly in the field of packaging technology and also in the field of medicinal packaging, there is an ever-increasing interest in containers that are coated with a barrier layer. Glass-like barrier layers containing silicon oxide are of special interest in this connection, because they have a number of desirable properties. Thus, for example, they are transparent, recyclable, and suitable for use in microwave devices. In this regard, glass-like barrier layers are superior to thin metal layers such as applied commercially at present to various polymer substrates.

Especially in the field of medicinal packaging, such as, for instance, vials, it is further desirable when the packaged substances can be discharged as completely as possible. In this case, particularly for liquid pharmaceuticals, the adhesion of the packaged material to the container wall plays a contributory role, with this contribution even proportionally increasing with decreasing package size. This effect is undesirable already for the reason that, among other things, it can result in dosing variations. Moreover, a noticeable loss can occur in the case of expensive medications.

Known from the prior art in order to remedy these problems are hydrophobic coatings. Such an approach consists in the application of silicone oils or the baking-in of silicone oil emulsions. Such coatings are known, for example, from U.S. Pat. No. 2,504,482 A. In this case, however, the following drawbacks exist: Thick layers are required, resulting in increased risks in regard to the leaching out of the silicone oils and the formation of contaminating particles of silicone. Moreover, the production process may be associated with a large amount of reject. The production process is difficult to monitor and quality assurance is problematic.

Another approach consists in coating with fluorine-containing layers, such as are known, for example, from DE 199 21 303 C1. Provided for this purpose are coatings that, in addition to fluorine, also contain the elements Si, C, O, and H and for which, in regard to the fluorine content and carbon content, the carbon content is greater than or equal to 10% for fluorine contents of less than 0.1%, while the carbon content is greater than or equal to 5% for fluorine contents greater than or equal to 0.1%.

However, high silicon contents may be incompatible or undesirable, depending on the nature of the packaged material. The same may also hold true for the fluorine present. In addition, the contact angle of the layers known from DE 199 21 303 C1 decreases following autoclaving.

The invention is therefore based on the problem of providing low-silicon coatings that are very hydrophobic and have a further improved temperature stability.

This problem is already solved in a highly surprising and simple manner by way of the subject of the independent claims. Advantageous embodiments and further developments of the invention are given in the dependent claims.

The invention provides a composite material having a substrate and an uppermost layer, with the composite material being suitable for improving the emptying of residual contents from packaging and with it being possible by way of the layer surface to change the wetting or draining behavior of liquids or suspensions relative to the uncoated substrate material.

To this end, the composite material has a substrate and a coating that is deposited on it and that forms at least a part of the surface of the coated substrate. The coating has, as principal component, a compound containing the elements Si, C, O, and H, with further elements, apart from Si, O, C, and H, having a content of less than 10 at %, preferably less than 5 at %. This compound has a composition $SiO_xC_yH_z$, in which x is at most 1.2. Here, the unit at %, similarly to mole percent, gives the relative proportions of the respective elements, the relative proportion of the elements given in units of at % being independent of the compound in which the elements are present.

In particular, it was found for especially stable and hydrophobic layers that, in this case, the compound has a composition $SiO_xC_yH$, with x less than 1. Here, in a further development of the invention, x may lie particularly in the range of 0.6 to 0.9, preferably in the range of 0.7 to 0.8. Furthermore, for especially stable layers, composition ranges with y in the range of 1.2 to 3.3, preferably in the range of 1.5 to 2.5, have proven to be especially advantageous.

Provided in accordance with the invention in order to deposit such a coating is a method for the production of a composite material, in which a coating is deposited by means of plasma-assisted chemical vapor deposition onto the substrate, whereby, for deposition, a process gas having a silicon-containing gas component, as well as carbon and oxygen as further gas components, is admitted into a reaction chamber, which is bounded at least in part by the substrate, and a plasma in the reaction chamber is ignited by means of pulsed irradiation of electromagnetic energy, resulting in the formation of reaction products in the plasma, which are deposited as a coating on the substrate, with this layer or, in the case of a multilayer coating, the uppermost layer, having a composition of the form $SiO_xC_yH_z$, in which the proportion of x is at most 1.2, and with other elements, apart from fluorine and silicon, having a content of less than 10 at %, preferably less than 5 at %.

Plasma-assisted chemical vapor deposition has proven to be reliable for the production of the coatings according to the invention. However, it is not ruled out that other chemical or physical vapor phase deposition methods may also be suitable for the production of layers.

A composite material, such as can be produced using the method described above, may be illustrated, in particular, also by a method in which the coating is deposited on the substrate by means of plasma-assisted chemical vapor deposition in which, for the deposition, a process gas having a silicon-containing gas component, as well as carbon and oxygen as further gas components, is admitted into a reaction chamber, which is bounded at least in part by the substrate, and a plasma in the reaction chamber is ignited by means of pulsed irradiation of electromagnetic energy, resulting in the formation of reaction products in the plasma, which are deposited as a layer on the substrate, with a pulsed plasma having a pulse duration in the range of 0.1 µs-500 µs, preferably 0.5 µs-100 µs, particularly preferably 1 µs-50 µs, being used. Typical pulse lengths of conventional methods lie, by contrast, in the millisecond range. In contrast, the pulses, as employed according to the invention, are shorter by at least a factor of 10. The shortened reaction time in the plasma is regarded as a possible cause of the fact that layers having novel compositions can be deposited by using the short pulses employed according to the invention. The short pulses enable the formation of certain reaction products, in particular the establishment of a chemical equilibrium in the plasma, to be suppressed.

If silicone oils are applied as a hydrophobic coating, as is known from U.S. Pat. No. 2,504,482 A, a generally more fluid film that is not firmly bound to the substrate is obtained. In accordance with the invention, in contrast to this, a condensate, in particular a solid condensate, is obtained as coating on account of the vapor phase deposition. This coating is generally a solid layer or a polymerizate, with the coating being bound also to the substrate or at least adhering firmly to it. In addition, it is possible to achieve, in particular, a cross-linking of the layer components. In the case of a deposition by means of a plasma, the layer may also be characterized here as a plasma polymer.

In order to be able to deposit the above-described coating having the unconventional composition by means of plasma-induced vapor phase deposition, in particular, a plasma is suitable in which, by means of a suitably chosen process parameter, a minimized energy density is ensured in the plasma, which, nonetheless, ignites in a stable manner. This plasma, in particular, is further detectable through a very weak emission by means of a photon-sensitive detector, which is introduced in the area surrounding the plasma. Thus, for the production of the uppermost layer, a plasma process with an average energy input per mass $\epsilon_M$, in a range of $10^{-1}$ J/kg to $10^9$ J/kg, preferably in a range of $10^2$ J/kg to $5\times10^6$ J/kg, has proven advantageous, with the average energy input per mass $\epsilon_M$ being defined by $$\varepsilon_M = \frac{\overline{W}}{\sum_{1}^{i} F_i \cdot \tilde{M}_i},$$

with the mean power $$\overline{W} = \frac{\Delta t_{pd}}{\Delta t_{pd} + \Delta t_{pp}} \cdot W_p.$$

Here, $\overline{W}$ represents the mean microwave power, $F_i$ the flow of the component i of the process gas mixture having the components: $O_2$, precursor, and, if appropriate, a carrier gas, $\tilde{M}_i$ the molecular weight of the component i, $\Delta t_{pb}$ the pulse duration, $\Delta t_{pt}$ the pulse phase, and $W_p$ the pulse power. It is assumed that, by using these process parameters and a suitably chosen process gas, which need not necessarily also contain a silicon-containing gas component, and/or carbon and/or oxygen as further gas components, it is also possible to deposit other coatings having unconventional composition.

In the pulsed plasma, a pulse pause without energy input is preferably constantly passed between the pulses, this pulse pause being greater than the pulse duration, which preferably lies between 0.1 ms and 200 ms, particularly preferably between 0.5 ms and 100 ms, most particularly preferred between 1 ms and 50 ms. Pulse pauses of constant length are particularly preferred. It is possible in this manner for the deposition to take place with a constantly low power averaged over time. To this end, the pulse pauses need not be exactly identical in length. Instead, a certain variation of the durations of the pulse pauses can take place. Thus, the pulse pauses may vary in their duration by a factor of 2, for example. In a further development of the invention in order to achieve lower power densities averaged over time and yet still ensure ignition of the plasma, the ratio of pulse pauses to pulse durations may be at least 5:1, preferably at least 10:1.

With the very low power densities in the plasma, it is possible to achieve the deposition of the layer having the unconventional composition from a process gas with otherwise conventional precursor gases. Accordingly, $SiO_xC_yH_z$ coatings with x in the range of 0.0 to 1.2, y in the range of 0.0 to 6.0, and z in the range of 0.0 to 6.0 can be deposited. In particular, it is also possible to produce a fluorine-free coating, which nonetheless has a high degree of hydrophobicity and, moreover, is stable to actions such as, for instance, autoclaving.

A fluorine-free coating is understood to mean a coating that does not contain any significant fluorine fraction. Obviously, however, it cannot be ruled out that, due to contaminants in the process gas, for example, minimal amounts of fluorine may still be contained in the coating.

In order to provide the low power densities for the deposition and nonetheless achieve a good ignition behavior of the plasma in the process gas, it is advantageous to use very short pulses of electromagnetic radiation, preferably microwave pulses. Thus, in a further development of the invention, it is provided that a pulsed plasma with pulse durations in the range of 0.1 µs-500 µs, preferably 0.5 µs-100 µs, particularly preferably 1 µs-50 µs, are used.

In order to improve the barrier effect of the coating, it is possible, according to an advantageous further development of the invention, to embed an inorganic layer between the coating with a compound that contains the elements C, O, and H and forms the uppermost layer and the substrate. This inorganic layer is also deposited preferably by means of plasma-assisted vapor phase deposition. Preferably, this layer has a composition of the form $SiO_{1.0-2.8}C_{0.0-0.5>}$.

A high silicon fraction in relation to oxygen in the surface layer can also be achieved, in particular, by employing a high fraction of silicon precursor in the process gas. When an organosilicon precursor is used, the volume fraction thereof in the process gas mixture is adjusted in this case to be more than 10%, preferably more than 50%, particularly preferably more than 95%.

The invention is provided, in particular, for the inner coating of hollow bodies, in which the hydrophobic coating is applied to the inner side of the hollow body so as to improve, for instance, the emptying of residual contents. However, the invention can also be employed for other intended purposes. For example, it is possible in general to provide easily cleanable surfaces with the coating.

Glass or polymers, in particular, plastics, come into consideration as a material for hollow bodies. Preferably, the invention is employed for the coating of pharmaceutical packaging, such as, for example, vials, syringes, or carpules or of components for pharmaceutical packaging, such as, for example, needles or stoppers. Suitable plastics are, among others, COC (cyclo-olefin copolymer) and COP (cyclo-olefin polymer), on which a good adhesion of the layer is achieved. Borosilicate glass, among others, is well suitable as a glass.

It is possible by means of the invention to improve in a demonstrable manner the emptying of residual contents of a hollow body as a substrate in comparison to an uncoated hollow body. This is reflected also in the draining behavior of the coated hollow body in comparison to the uncoated hollow body, which can be improved such that a closed hollow body half filled with liquid, after shaking of the liquid and immediately after a draining time of 5 s, has a lower percentage of surface area of less than 50%, preferably less than 20%, of adhering liquid in the region of the inner surface than does an uncoated hollow body. Provided according to another aspect of the invention, therefore, is generally a composite material in the form of an inner-coated hollow body for which the emptying of residual contents is improved in a demonstrable manner in comparison to the uncoated hollow body and/or the draining behavior of the coated hollow body is improved in comparison to the uncoated hollow body such that a closed hollow body half filled with a liquid, after shaking of the liquid and immediately after a draining time of 5 s, has a lower area fraction of less than 50%, preferably less than 20%, of adhering liquid in the region of the inner surface than an uncoated hollow body.

According to another aspect of the invention, the coating according to the invention may be produced in such a hydrophobic manner that a composite material having a substrate and a coating deposited on it is obtained, for which the coating a) has a contact angle for water of $>=90°$, preferably $>=100°$, or b) an outflow or draining angle of $<90°$, preferably $<50°$, particularly preferably $<30°$, for a water droplet having a volume of 26 µL.

The coating is further characterized in an especially advantageous manner also by its improved resistance to various influences, such as can arise during the packing of pharmaceutical packaging. Thus, it could be found that, for a coating according to the invention, when one of the following sterilization tests was conducted, i) an autoclave test at 121° C., 30 min,
    ii) depyrogenation at 300° C., 20 min,
    iii) gamma sterilization with 25 kGy,
    iv) an electron-beam sterilization with 25 kGy, or
    v) an ethylene oxide sterilization (ETO sterilization)
    the contact angle of the coating for water is changed by less than 4°, preferably by less than 3°, particularly preferably by less than 1°, and/or
    the outflow or draining angle for a droplet of water having a volume of 26 µL is changed by less than 30°, preferably by less than 20°, particularly preferably by less than 10°. Provided according to another aspect of the invention, therefore, is generally a composite material, preferably in the form of a container, which includes a substrate and a coating deposited on it, with the coating having respectively at least one and preferably all of the aforementioned features i) to v).

Such a coating also exhibits a high storage stability. Thus, it could be shown that, after a storage test of the composite material with an aqueous liquid in contact with the layer surface, the above-mentioned features of the coating are still fulfilled after a storage time of 2 weeks at 60° C. Accordingly, such a layer has the following characteristics after the storage test:

the contact angle of the layer for water is changed by less than 4°, preferably by less than 3°, particularly preferably by less than 1°, in comparison to the contact angle before the storage test,
    the outflow or draining angle for a droplet of water having a volume of 26 µL is changed by less than 30°, preferably by less than 20°, particularly preferably by less than 10°, in comparison to the outflow or draining angle before the storage test,
    the coating still exhibits an outflow angle of $<90°$, preferably $<50°$, particularly preferably $<30°$, for a water droplet having a volume of 26 µL,
    the contact angle for water is still $>=90°$, preferably $>=100°$. Provided according to yet another aspect of the invention, therefore, is a composite material having a substrate and a coating deposited on it, preferably in the form of an inner-coated container, the coating of which has the aforementioned features after the storage test.

In order to achieve a good adherence of the coating according to the invention, it has further proven particularly advantageous when, prior to the deposition of the layer, the substrate is heated, preferably to a temperature of between 40° C. and 300° C., particularly preferably to a temperature of between 60° C. and 200° C. The heating can take place, in particular, by means of a plasma. On the one hand, it is possible in this way to dispense with an additional heating device; on the other hand, through the plasma treatment, an activation of the surface can take place simultaneously, which further improves the layer adhesion. Thus it is provided in a further development of the invention that the substrate is heated by means of a plasma process by using a noble gas, such as argon, or an inert gas, such as nitrogen, or an oxygen-containing gas, such as oxygen, or a nitrogen-containing gas, such as ammonia.

Alternatively or additionally, a heating can take place also outside of the coating reactor, preferably by means of an infrared radiator. Such a further development of the invention is, among other things, of advantage for coating plants with high throughputs. It is thus advantageously possible by means of an external heating to shorten the process time of the vacuum process.

The averaged power that is used for the plasma deposition is very low according to the invention. Therefore, it is generally advantageous when the mean power used for the heating process is higher than that used for the coating process. This is also reflected in the fact that the light emission of the plasma during the deposition of the coating is less, when averaged over time, than the light emission of the heating plasma, when averaged over time. Accordingly, the invention provides as another aspect a method for the production of a composite material, in which, prior to the deposition, the substrate is heated by means of a plasma process by using a noble gas, such as argon, or an inert gas, such as nitrogen, or an oxygen-containing gas, such as oxygen, or a nitrogen-containing gas, such as ammonia, and, subsequently, the coating is likewise deposited in a plasma process with pulsed plasma, with the light emission of the plasma during the deposition of the coating being, in this case, less by a factor of at least 10, preferably by a factor of at least $10^2$, particularly preferably even by a factor of at least $10^3$. For a good ignition of the plasma during the deposition of the coating, it is especially advantageous, moreover, when the gas exchange time between the heating and the coating process is as small as possible. In particular, the gas exchange time is less than 60 s, preferably less than 30 s, particularly preferably less than 15 s. In this way, the heating of the substrate surface is maintained as well.

In order to obtain the coating with the above-mentioned composition, it is further particularly preferred, as a formulation, to carry out the coating by plasma deposition with a process gas containing a carbon- and silicon-containing starting compound, preferably containing an organosilicon starting compound. Suitable for this purpose are, in particular, process gases that contain at least one of the following components:

hexamethyldisiloxane, tetramethyldisiloxane, hexamethyldisilazane, TMCTS, TMDSN, TMS.

Because the coating according to the invention represents at least a part of the surface and a permanent hydrophibicity is produced, it is further particularly preferred to provide a final product having the coating as part of the surface, or as the uppermost layer. In the case of coated hollow bodies as composite material, both a filled as well as a ready-to-fill container may be involved. In the case of pharmaceutical packaging, yet other treatment steps may follow prior to the filling.

For example, a lyophilization may take place. The container may also, if necessary, be additionally sterilized. Finally, the produced composite materials may also be sterilely packaged if necessary, either empty or filled, depending on the application case.

The invention will be explained below in detail on the basis of exemplary embodiments and with reference to the attached FIGURE.

The FIGURE shows a pulse diagram of microwave pulses used for the layer deposition, with the microwave intensity I being plotted versus the time t. The pulse durations $t_1$ of the pulses are very short with pulse durations in the range of 0.5 μs to at most 100 μs. The durations $t_2$ of the pulse pauses between the individual pulses are, by contrast, chosen to be appreciably longer, with preferably pulse pauses with lengths of between 0.5 and 100 milliseconds being adjusted. In any case, the ratio of the durations $t_2/t_1$ should be at least 5:1, preferably at least 10:1.

In the following, particularly advantageous variants of the deposition process according to the invention will be explained in brief.

1st Process Variant:

The substrate or substrates is or are preheated, preferably with a plasma ($O_2$, $N_2$, $NH_3$, noble gas), particularly preferably with an argon plasma. The preheating takes place to a surface temperature in the range of 40° C.-300° C., preferably 60° C.-200° C.

A high concentration of organosilicon precursor is employed in the process gas for the deposition of the hydrophobic coating. In this case, in particular, more than 10%, preferably more than 50%, particularly preferably even more than 95% of the organosilicon precursor is used in the process gas. In this case, the deposition takes place after a gas exchange time of less than 30 s following the heating phase, preferably less than 15 s, that is, as immediately after the heating as possible. A residual gas fraction of process gas from the heating process results in a facilitation of the ignition of the plasma for the coating process.

The layer deposition takes place in two steps. First, a very thin layer is deposited at higher power, resulting in a better plasma ignition for the next layer than when this first layer is dispensed with. The second layer is then deposited accordingly at lower power. Very short pulses with pulse durations in the range of 0.1 μs-500 μs, preferably 0.5 μs-100 μs, particularly preferably of 1 μs-50 μs, are employed for the deposition.

2nd Process Variant:

A combination layer made up of a barrier layer, in particular with a barrier against alkali leaching, and a coating of hydrophobic surface according to the invention applied onto it is produced. This combination layer results both in the reduction of a leaching out of substances from the substrate (e.g., ion leaching from glass) and also in a good emptying of residual contents and a good draining behavior. The deposition of this combination layer is carried out in a continuous process.

First, the reaction chamber is evacuated. There then takes place a heating of the substrate, preferably with an oxygen or argon plasma, to a temperature of T>150° C., preferably >200° C. Subsequently, a barrier layer is deposited using a mixture of organosilicon precursor and oxygen, the precursor concentration in the process gas mixture being less than 20%, preferably less than 10%. Subsequent to this, there takes place a cooling phase, during which the temperature drops by at least 20° C., preferably by at least 50° C. Following the cooling phase, process gas, preferably argon, is admitted and a plasma is ignited. In this renewed short heating phase, the substrate is brought to the target temperature. There then takes place a gas exchange on a process gas mixture containing organosilicon precursor. Renewed plasma ignition results in the deposition of a hydrophobic coating according to the invention. Subsequently, the reaction chamber is brought to atmospheric pressure.

3rd Process Variant:

This variant is similar to the 2nd process variant described above, although the coating process takes place in a discontinuous manner. For deposition of the first layer, which represents a barrier layer, the reaction chamber is evacuated, the substrate is heated in a plasma, preferably an oxygen or argon plasma, to a temperature of T>150° C., preferably >200° C., and then the barrier layer is deposited using a mixture made up of organosilicon precursor and oxygen with a precursor concentration of less than 20%, preferably less than 10%. Following the deposition, the reaction chamber is brought to atmospheric pressure.

The reaction chamber is evacuated once again and then the substrate is brought to the target temperature in a short heating process in a plasma, preferably using argon as the process gas. There follows a gas exchange on a gas mixture containing organosilicon precursor for deposition of the hydrophobic coating according to the invention and a plasma ignition. After the layer has been deposited, the reaction chamber is brought to atmospheric pressure.

Several detailed exemplary embodiments will be described below.

EXEMPLARY EMBODIMENT 1

Hydrophobic Inner Coating of Vials a) A vial made of borosilicate glass (SCHOTT Fiolax), which has a 14-mL volume when filled to the brim, is placed in a reactor. In this case, the vial lies initially on the bottom side of the reactor on a sealed surface. Subsequently, the top side of the reactor is lowered into place and the interior of the vial is evacuated until a base pressure of <0.05 mbar is reached. The outside space remains at atmospheric pressure during the entire treatment operation. While, on the bottom side, the connection to the vacuum is maintained, a gas-inlet valve is opened and, as a first process gas, oxygen is admitted via the gas supply. Subsequently, by means of a microwave source, pulsed microwave energy with a frequency of 2.45 GHz is applied and a plasma is ignited. The substrate is heated with the plasma to a temperature of 250° C. Afterwards, during a time of gas exchange, a mixture consisting of hexamethyldisiloxane and oxygen is admitted and a glass-like $SiO_x$ layer with a thickness of 100 nm is deposited. Subsequently, the plant is brought to atmospheric pressure and the vial is cooled to room temperature.

The interior of the vial is then evacuated again to a base pressure of <0.05 mbar and, as the third process gas, argon gas is admitted with a flow of 86.5 sccm and at a pressure of 0.5 mbar. Only starting from this point in time, as soon as pulsed microwave energy from the microwave source with a frequency of 2.45 GHz and a mean microwave power of 900 W via the waveguide is input into the reactor chamber, a plasma is ignited in the interior of the vial, while, on the outside, no plasma ignites on account of the atmospheric pressure. The vial is heated during the operation to a temperature of 150° C. for a first treatment time of 61 s. Toward the end of the first plasma treatment, the microwave energy is stopped. There then follows a gas exchange time, during which a fourth gas mixture consisting of hexamethyldisiloxane is passed into the interior of the vial with an HMDSO flow of 15 sccm at a pressure of 0.2 mbar. Once pulsed microwave energy is passed from the microwave source with a frequency of 2.45 GHz and a mean microwave power of 2.4 W and a pulse duration of 12 μs as well as a pulse pause of 10 ms and a pulse power of 2000 W into the reactor chamber via the waveguide, a plasma ignites inside the vial and, for a coating duration of 90.2 s, an organosilicon hydrophobic layer with a mean layer thickness of 40 nm is applied. Toward the end of the coating operation, the microwave energy is stopped, the supply of the process gas is discontinued, and the interior of the vial is brought up to atmospheric pressure.

i) Without a Load Test, the Vial Coated in this Way Shows the Following Properties:

a) Contact Angle:

A measurement of the contact angle for water gives a value of 110°±2° for coated vials. The layers are accordingly strongly hydrophobic.

b) High Emptying of Residual Contents:

The coated vials further have a clearly improved emptying of residual contents in comparison to uncoated Fiolax vials: Uncoated and coated vials are weighed and subsequently filled with 10 mL of water. The vials are drained by means of a needle cannula placed on the bottom of the vial until only the residual volume adhering to the container wall still remains in the container. After withdrawal of the liquid, the vials are reweighed. The weight for the residual amount remaining in the vial is determined from the difference between the weight of the vial after draining and the weight of the unfilled vial.

For an uncoated vial, there results a residual amount having a weight of 15.3 mg; for hydrophobically coated vials, by contrast, there is a residual amount having a weight that lies below the error of measurement of 10.4 mg.

c) Good Draining Behavior Over Time

The coated vials have a good draining behavior for water over time:

They are filled with 10 mL of water, which is dyed with a white dye for purposes of better visualization, and shaken. After shaking, no droplets or only a few droplets adhere to the container wall (percentage of surface area of <10%) following a draining time of 2 s, whereas, for uncoated Fiolax vials, a water film or droplets still adhere to the surface and the percentage of surface area is greater than 50%.

d) Outflow or Draining Angle

The outflow or draining angle for droplets having a volume of 26 μL lies at 20°.

ii) Properties after the autoclaving test:

After hot steam sterilization (autoclaving test) with distilled water at 121° C. for 30 minutes, the following properties are obtained;

a) Contact Angle

After the autoclaving test, the contact angle remains unchanged at 110°±2°. Consequently, the layers are very stable toward autoclaving, because no change in the contact angle is detectable.

b) High Emptying of Residual Contents

In the determination of the emptying of residual contents, a residual amount having a weight below the error of measurement of 10.4 mg results for hydrophobically coated vials after the autoclaving test. Consequently, the product property of a high emptying of residual contents exists after the autoclaving test.

c) Good Draining Behavior Over Time

The coated vials have a good draining behavior for water over time after the autoclaving test: After shaking, no droplets or only a few droplets adhere to the container wall (percentage of surface area of <10%) following a draining time of 2 s.

iii) Properties after Depyrogenation:

After depyrogenation of hydrophobically coated vials, tested by means of an oven storage at 300° C. for 30 minutes in dry air, the following results are obtained:

a) High Emptying of Residual Contents:

In the determination of the emptying of residual contents for hydrophobically coated vials after depyrogenation, a residual amount having a weight below the measurement error of 10.4 mg is obtained. Consequently, the product property of a high emptying of residual contents remains even after depyrogenation.

b) Good Draining Behavior Over Time:

The coated vials also have a good draining behavior for water over time after the depyrogenation: After shaking, no droplets or only a few droplets adhere to the container wall (percentage of surface area of <10%) following a draining time of 2 s.

iv) Resistance of the Coating to Abrasion:

Hydrophobically coated vials are filled with water and shaken in an apparatus with 200 strokes for a duration of 1 minute.

a) High Emptying of Residual Contents:

In the determination of the emptying of residual contents, a residual amount having a weight below the measurement error of 10.4 mg is obtained after the shaking test.

b) Good Draining Behavior Over Time:

The vials still have a good draining behavior after the shaking test. Consequently, the layers are very resistant to abrasion.

EXEMPLARY EMBODIMENT 2

Analysis of the Layer Composition

Vials made of borosilicate glass (SCHOTT Fiolax), which have 14-mL volume when filled to the brim, are coated by using the same method and the same process parameters as in exemplary embodiment 1. However, a thicker hydrophobic layer having a layer thickness of 100 nm is applied.

The composition of the hydrophobic layers is determined by means of XPS analysis. The following composition is found: Si, 26.4 at %; O, 19.8 at %; C, 53.7 at %. Accordingly, the O/Si ratio is very low and, surprisingly, even less than 1. The carbon content in this case, 50 at %, is very high.

Accordingly, the layer has a composition $SiO_xC_yH_z$ with y in the range of 1.2 to 3, particularly in the range of 1.5 to 2.5, and x in the range of 0.6 to 0.9, particularly in the range of 0.7 to 0.8.

EXEMPLARY EMBODIMENT 3

Hydrophobic Inner Coating of Vials a) A vial made of borosilicate glass (SCHOTT Fiolax), type 2R, which has a 4-mL volume when filled to the brim, is placed in a reactor. In this case, the vial lies initially on the bottom side of the reactor on the sealed surface. Subsequently, the top side of the reactor is lowered into place and the interior of the vial is evacuated until a base pressure of <0.05 mbar is reached. The outside space remains at atmospheric pressure during the entire treatment operation. While, on the bottom side, the connection to the vacuum is maintained, a gas-inlet valve is opened and, as the first process gas, oxygen is admitted via the gas supply. Subsequently, by means of a microwave source, pulsed microwave energy with a frequency of 2.45 GHz is introduced and a plasma is ignited.

The substrate is heated with the plasma to a temperature of 250° C. Afterwards, during a time of gas exchange, a mixture consisting of hexamethyldisiloxane and oxygen is admitted and a glasslike $SiO_x$ layer with a thickness of 100 nm is deposited. Subsequently, the plant is brought to atmospheric pressure and the vial is cooled to room temperature.

The interior of the vial is then evacuated again to a base pressure of <0.05 mbar and, as the third process gas, argon gas is admitted with a flow of 86.5 sccm and at a pressure of 0.5 mbar. Only starting from this point in time, as soon as pulsed microwave energy from the microwave source is input with a frequency of 2.45 GHz and a mean microwave power of 500 W via the waveguide into the reactor chamber is a plasma ignited in the interior of the vial, while, on the outside, no plasma ignites on account of the atmospheric pressure. The vial is heated during the operation to a temperature of 80° C. for a first treatment time of 30 s. Toward the end of the first plasma treatment, the microwave energy is stopped. There then follows a gas exchange time, during which a second gas mixture consisting of hexamethyldisiloxane is passed into the interior of the vial with an HMDSO flow of 15 sccm at a pressure of 0.1 mbar. As soon as pulsed microwave energy is passed from the microwave source with a frequency of 2.45 GHz and a pulse duration of 100 µs as well as a pulse pause of 60 ms and a pulse power of 900 W into the reactor chamber via the waveguide, a plasma ignites inside the vial and, for a coating duration of 95 s, an organosilicon hydrophobic layer is introduced. Toward the end of the coating operation, the microwave energy is stopped, the supply of the process gas is discontinued, and the interior of the vial is brought up to atmospheric pressure.

i) Properties without Load Test:

a) High Emptying of Residual Contents:

The hydrophobically coated vials further have a clearly improved emptying of residual contents in comparison to uncoated Fiolax vials: Uncoated and coated vials are weighed and subsequently filled with 4 mL of water. The vials are drained by means of a needle cannula placed on the bottom of the vial until only the residual volume adhering to the container wall still remains in the container. After withdrawal of the liquid, the vials are reweighed. The weight for the residual amount remaining in the vial is determined from the difference between the weight of the vial after draining and the weight of the unfilled vial.

For an uncoated vial, there results a residual amount having a weight of 18.0 mg; for hydrophobically coated vials, by contrast, there is a residual amount having a weight that lies below the measurement error of 10.4 mg.

b) Good Draining Behavior Over Time

The coated vials have a good draining behavior for water over time: They are filled with 10 mL of water, which is dyed with a white dye for purposes of better visualization, and shaken. After shaking, no droplets or only a few droplets adhere to the container wall (percentage of surface area of <10%) following a draining time of 2 s, whereas, for uncoated Fiolax vials, a water film or droplets still adhere to the surface and the percentage of surface area is greater than 50%.

d) Outflow or Draining Angle

The outflow or draining angle for droplets having a volume of 264 lies at 20°.

ii) Properties after the Autoclaving Test:

After hot steam sterilization (autoclaving test) with distilled water at 121° C. for 30 minutes, the following properties are obtained;

a) Contact Angle:

After the autoclaving test, the contact angle remains unchanged at 110°±2°. Consequently, the layers are very stable toward autoclaving, because no change in the contact angle is detectable.

b) High Emptying of Residual Contents:

In the determination of the emptying of residual contents, a residual amount having a weight below the measurement error of 10.4 mg results for hydrophobically coated vials after the autoclaving test. Consequently, the product property of a high emptying of residual contents remains even after the autoclaving test.

c) Good Draining Behavior Over Time

The coated vials have a good draining behavior for water over time after the autoclaving test: After shaking, no droplets or only a few droplets adhere to the container wall (percentage of surface area of <10%) following a draining time of 2 s.

iii) Properties after Depyrogenation:

After depyrogenation of hydrophobically coated vials, tested by means of an oven storage at 300° C. for 30 minutes in dry air, the following results are obtained:

a) High Emptying of Residual Contents:

In the determination of the emptying of residual contents for hydrophobically coated vials after depyrogenation, a residual amount having a weight below the measurement error of 10.4 mg is obtained. Consequently, the product property of a high emptying of residual contents remains even after depyrogenation.

b) Good Draining Behavior Over Time:

The coated vials have a good draining behavior for water over time even after the depyrogenation: After shaking, no droplets or only a few droplets adhere to the container wall (percentage of surface area of <10%) following a draining time of 2 s.

iv) Resistance of the Coating to Abrasion:

Hydrophobically coated vials are filled with water and shaken in an apparatus with 200 strokes for a duration of 1 minute.

a) High Emptying of Residual Contents:

In the determination of the emptying of residual contents, a residual amount having a weight below the measurement error of 10.4 mg is obtained after the shaking test.

b) Good Draining Behavior Over Time:

The vials still have a good draining behavior after the shaking test. Consequently, the layers are very resistant to abrasion.

EXEMPLARY EMBODIMENT 4

Hydrophobic Single Layer

The hydrophobic single layer is produced in analogy to the exemplary embodiment, but the prior deposition of a barrier layer is dispensed with. Tests corresponding to those in exemplary embodiment 2 reveal that the coated vials also have the properties mentioned in exemplary embodiment 2.

It is obvious to the person skilled in the art that the invention is not limited to the exemplary embodiment described above, but rather can be varied in diverse ways and the features of the individual exemplary embodiments can also be combined with one another.

The invention claimed is:

1. A composite material comprising:
  a substrate; and
  a hydrophobic coating deposited on at least a part of the surface of the substrate, the coating having a compound comprising Si, C, O, and H along with further elements, the further elements having a content of less than 10 at %, said compound having a composition $SiO_xC_yH_z$, in which
x lies in the range of 0.6 to 0.9,
y lies in the range of 1.2 to 3.3, and
z lies in the range of 0.0 to 6.0.

2. The composite material according to claim 1, wherein the coating is fluorine-free.

3. The composite material according to claim 1, wherein the coating comprises a polymerizate.

4. The composite material according to claim 1, further comprising an inorganic layer is embedded between the coating and the substrate.

5. The composite material according to claim 1, wherein the substrate comprises a hollow body and the coating is deposited on an inner side of the hollow body.

6. The composite material according to claim 5, wherein the coating improves the emptying of residual contents of the hollow body in comparison to the uncoated hollow body.

7. The composite material according to claim 1, wherein the substrate comprises a glass hollow body or a polymer hollow body.

8. The composite material according to claim 1, wherein the substrate is a pharmaceutical packaging selected from the group consisting of a vial, a syringe, and a carpule.

9. The composite material according to claim 1, wherein the coating has a contact angle for water of greater than or equal to 90°, or an outflow or draining angle of less than 90°, for a water droplet having a volume of 26 μL.

10. The composite material according to claim 9, wherein, when a sterilization test selected from the group consisting of an autoclave test at 121° C., 30 minutes, a depyrogenation test at 300° C., 20 minutes, gamma sterilization test with 25 kGy, an electron-beam sterilization test with 25 kGy, and an ethylene oxide sterilization test was conducted, the contact angle is changed by less than 4° or the outflow or draining angle is changed by less than 30°.

11. The composite material according to claim 10, wherein the contact angle is changed by less than 1°.

12. The composite material according to claim 10, wherein the outflow or draining angle is changed by less than 10°.

13. The composite material according to claim 9, wherein, after a storage test of the composite material with an aqueous liquid in contact with the coated substrate, after a storage time of 2 weeks at 60° C., the contact angle is changed by less than 4, or the outflow or draining angle is changed by less than 30°, or the coating still exhibits the outflow or draining angle of less than 90°, or the coating has the contact angle of greater than or equal to 90°.

14. The composite material according to claim 1, wherein the content of the further elements is less than 5 at %.

15. The composite material according to claim 1, wherein x lies in the range of 0.7 to 0.8.

16. The composite material according to claim 1, wherein y lies in the range of 1.5 to 2.5.

17. The composite material according to claim 1, wherein the coating comprises a cross-linked polymerizate.

18. The composite material according to claim 1, wherein the substrate is a component for a pharmaceutical packaging selected from the group consisting of a needle and a stopper.

19. The composite material according to claim 1, wherein the coating has a contact angle for water of greater than or equal to 100° or an outflow or draining angle of less than 50°, for a water droplet having a volume of 26 μL.

20. The composite material according to claim 1, wherein the coating an outflow or draining angle of less than 30° for a water droplet having a volume of 26 μL.

21. A method for producing a composite material, comprising:
depositing a coating on a substrate by plasma-assisted chemical vapor deposition in which, for deposition, a process gas having a silicon-containing gas component, as well as carbon and oxygen as further gas components, is admitted into a reaction chamber, which is bounded at least in part by the substrate, and
igniting a plasma in the reaction chamber by pulsed irradiation of electromagnetic energy, resulting in the formation of reaction products in the plasma, which are deposited as a layer on the substrate, wherein the pulsed irradiation of electromagnetic energy comprises a pulsed plasma having a pulse duration in the range of 0.1 μs to 100 μs.

22. The method according to claim 21, wherein said layer has a composition of the form $SiO_xC_yH_z$, wherein x lies in the range of 0.6 to 0.9, y lies in the range of 1.2 to 3.3, and z lies in the range of 0.0 to 6.0, and wherein said composition comprises other elements, apart from Si, O, C, and H, that have a content of less than 10 at %.

23. The method according to claim 22, wherein igniting said plasma comprises using a plasma process with an average energy input per mass $\epsilon_M$ in a range of $10^{-1}$ J/kg to $10^9$ J/kg with the average energy input per mass $\epsilon_M$ being defined by $$\varepsilon_M = \frac{\overline{W}}{\sum_1^i F_i \cdot \tilde{M}_i},$$

with the mean power $$\overline{W} = \frac{\Delta t_{pd}}{\Delta t_{pd} + \Delta t_{pp}} \cdot W_p,$$

where $\overline{W}$ represents the mean microwave power, $F_i$ the flow of the component i of the process gas mixture having the components $O_2$, precursor, and, if appropriate, a carrier gas, $\tilde{M}_i$ the molecular weight of the component i, $\Delta t_{pd}$ the pulse duration, $\Delta t_{pp}$ the pulse pause, and $W_p$ the pulse power.

24. The method according to claim 21, comprising continually passing a constant pulse pause without energy input between the pulses, the pulse pause being greater than the pulse duration.

25. The method according to claim 24, further comprising a ratio of pulse pauses to pulse durations is at least 5:1.

26. The method according to claim 21, wherein the coating by plasma deposition is produced with a process gas comprising an organosilicon starting compound.

27. The method according to claim 26, further comprising using a process gas composition, in which a fraction of the organosilicon starting compound is greater than 10% for the deposition of the layer.

28. The method according to claim 21, wherein the pulsed irradiation of electromagnetic energy comprises a pulsed plasma having a pulse duration in the range of 0.5 μs to 100 μs.

29. The method according to claim 21, wherein the pulsed irradiation of electromagnetic energy comprises a pulsed plasma having a pulse duration in the range of 1 μs to 50 μs.

30. A method for producing a composite material, comprising:
depositing a coating on a substrate by plasma-assisted chemical vapor deposition in which, for deposition, a process gas having a silicon-containing gas component, as well as carbon and oxygen as further gas components, is admitted into a reaction chamber, which is bounded at least in part by the substrate;

igniting a plasma in the reaction chamber by pulsed irradiation of electromagnetic energy, resulting in the formation of reaction products in the plasma, which are deposited as a layer on the substrate, wherein the pulsed irradiation of electromagnetic energy comprises a pulsed plasma having a pulse duration in the range of 0.1 µs to 500 µs; and prior to the deposition of the layer, heating the substrate to a temperature between 40° C. and 300° C.

31. The method according to claim 30, wherein heating the substrate comprises heating with a plasma process by using a gas selected from the group consisting of a noble gas, an inert gas, an oxygen-containing gas, and a nitrogen-containing gas.

32. The method according to claim 30, wherein heating the substrate comprises heating the substrate outside of the coating reactor with an infrared radiator.

33. The method according to claim 32, wherein the pulsed irradiation of electromagnetic energy during the deposition of the coating, averaged over time, is less by a factor of at least 10 than the light emission of the infrared radiator, averaged over time.

34. The method according to claim 30, further comprising a gas exchange time between the heating and the coating process of less than 60 seconds.

35. The method according to claim 30, wherein the mean power used for the heating process is higher than for the coating process.

36. The method according to claim 30, wherein the temperature is between 60° C. and 200° C.

* * * * *